(12) United States Patent
Salessi et al.

(10) Patent No.: US 9,323,304 B2
(45) Date of Patent: Apr. 26, 2016

(54) DYNAMIC SELF-CORRECTING POWER MANAGEMENT FOR SOLID STATE DRIVE

(71) Applicant: NXGN DATA, INC., Irvine, CA (US)

(72) Inventors: Nader Salessi, Laguna Niguel, CA (US); Joao Alcantara, Irvine, CA (US)

(73) Assignee: NXGN Data, Inc., Irvine, CA (US)

( * ) Notice: Subject to any disclaimer, the term of this patent is extended or adjusted under 35 U.S.C. 154(b) by 159 days.

(21) Appl. No.: 14/133,159

(22) Filed: Dec. 18, 2013

(65) Prior Publication Data

US 2015/0169021 A1      Jun. 18, 2015

(51) Int. Cl.
*G06F 1/00*      (2006.01)
*G06F 1/26*      (2006.01)

(52) U.S. Cl.
CPC ...................... *G06F 1/266* (2013.01)

(58) Field of Classification Search
CPC ....... G06F 1/3202; G06F 1/3231; G06F 1/26; G06F 1/206; G06F 1/3228; G06F 1/108; G06F 1/3289; G06F 1/266; H04L 12/12; H04L 12/10
See application file for complete search history.

(56) References Cited

U.S. PATENT DOCUMENTS

| | | | |
|---|---|---|---|
| 8,386,818 B2 | 2/2013 | Hong | |
| 2013/0097433 A1 | 4/2013 | Boorman et al. | |
| 2013/0111226 A1* | 5/2013 | Ananthakrishnan et al. | 713/300 |
| 2014/0095740 A1* | 4/2014 | Ozawa | 710/18 |
| 2014/0344602 A1* | 11/2014 | Son et al. | 713/323 |
| 2015/0098291 A1* | 4/2015 | Datla et al. | 365/227 |

* cited by examiner

*Primary Examiner* — Zahid Choudhury
(74) *Attorney, Agent, or Firm* — Lewis Roca Rothgerber Christie LLP

(57) ABSTRACT

A system and method for operating a solid state drive (SSD) within power limitations while maintaining SSD performance. In one embodiment a power management integrated circuit (PMIC) is used to measure power consumption, and a built-in self-test (BIST) procedure is used to exercise the storage device, and to calibrate the power consumed by various SSD operations. The results are stored in a power consumption cost table. In one embodiment, a procedure to dynamically adjust the power consumption cost table is employed. A power credit allocation scheme is used, along with the power consumption cost table, to track and limit the power consumed by the SSD in operation.

12 Claims, 4 Drawing Sheets

DYNAMIC SELF-CORRECTING POWER MANAGEMENT FOR SOLID STATE DRIVE

FIELD

The following description relates to data storage and more particularly to a system and method for storing data in, and retrieving data from, a solid state drive, while maintaining the power consumption of the solid state drive within an acceptable range.

BACKGROUND

Every day, several quintillion bytes of data may be created around the world. This data comes from everywhere: posts to social media sites, digital pictures and videos, purchase transaction records, bank transactions, sensors used to gather intelligence and data, such as climate information, cell phone GPS signal, and many others. This kind of data and its vast accumulation is often referred to as "big data." An increasing amount of this data eventually is stored and maintained in solid-state storage drives (SSD), operated by an SSD controller, and these may reside on networks or on storage accessible via the Internet, which may be referred to as the "cloud." This stored data may also require processing, or be subject to operations, such as read, write, erase, and/or during a search, query, encryption/decryption, compression, decompression, and other processes. These operations use power and cause a temperature increase in the SSD controller. Temperature increases in the SSD controller may degrade and slow performance in the controller.

An important function of a solid state drive (SSD) controller is power management. In an SSD, throttling techniques based on a static calibration may be used as an approach to power management. This approach requires allowing power margins to account for process, voltage and temperature variations on all SSD components including regulators, dynamic read-only-memory (DRAM), NAND flash devices, and the controller itself. The drawback of this approach is that in order to guarantee adequate margin to accommodate variations throughout the product life cycle there may be a significant loss in performance.

Thus, there is need for a system and method for managing power in an SSD, which provides performance near the highest performance achievable within an allocated power budget.

SUMMARY

In one embodiment of a system and method for operating a solid state drive (SSD) within power limitations while maintaining SSD performance, a power management integrated circuit (PMIC) is used to measure power consumption, and a built-in self-test (BIST) procedure is used to exercise the storage device, and to calibrate the power consumed by various SSD operations. The results are stored in a power consumption cost table. A power credit allocation scheme is used, along with the power consumption cost table, to track and limit the power consumed by the SSD in operation.

According to an embodiment of the present invention there is provided a system for power management in a solid state drive (SSD) including a flash memory, the system including: a controller; and a power management integrated circuit (PMIC), the controller configured to receive commands, each command corresponding to a requested read operation, a requested write operation, or a requested erase operation to be dispatched to the flash memory, the controller configured to place each command in the command queue, and to dispatch each command from the command queue to the flash memory, according to an algorithm, so as to maintain a power consumption of the solid state drive below a maximum acceptable power consumption value, the algorithm employing a power consumption cost table, the controller configured to dynamically adjust the power consumption cost table based on information received from the PMIC.

In one embodiment, the controller is configured to dynamically adjust the power consumption cost table by: performing a built-in-self-test (BIST) procedure including: a plurality of test read operations; a plurality of test write operations; and a plurality of test erase operations; and measuring the power consumed by the performing of the plurality of test read operations, the plurality of test write operations, and the plurality of test erase operations.

In one embodiment, the controller is configured to dynamically adjust the power consumption cost table prior to initial operation of the SSD.

In one embodiment, the controller is configured to dynamically adjust the power consumption cost table by correlating, during operation of the solid state drive, power consumption data from the PMIC with a frequency to simultaneously perform read operations, write operations, and erase operations.

In one embodiment, the controller is configured to dynamically adjust the power consumption cost table only when the power consumption of the solid state drive exceeds a threshold fraction of the maximum acceptable power consumption value.

In one embodiment, the threshold fraction is 50%.

In one embodiment, the controller includes a flash manager.

In one embodiment, the controller includes a central processing unit (CPU).

In one embodiment, the algorithm includes: forming a pool containing a quantity of credits proportional to the maximum acceptable power consumption value; removing a first quantity of credits from the pool for each write operation conducted, at the beginning of the write operation, and replacing the first quantity of credits at the completion of the write operation, the first quantity of credits being proportional to a mean power consumption of a write operation; removing a second quantity of credits from the pool for each read operation conducted, at the beginning of the read operation, and replacing the second quantity of credits at the completion of the read operation, the second quantity of credits being proportional to a mean power consumption of a read operation; removing a third quantity of credits from the pool for each erase operation conducted, at the beginning of the erase operation, and replacing the third quantity of credits at the completion of the erase operation, the third quantity of credits being proportional to a mean power consumption of an erase operation, the mean power consumption of the write operation, the mean power consumption of the read operation, and the mean power consumption of the erase operation being determined from the power consumption cost table; and delaying a command in the command queue when there are insufficient credits in the pool for the command.

According to an embodiment of the present invention there is provided a method for operating a solid state drive including a controller, a flash memory, and a power management integrated circuit (PMIC), the method including: receiving commands, each command corresponding to a requested read operation, a requested write operation, or a requested erase operation to be executed in the flash memory; placing each command in a command queue; dispatching each command from the command queue to the flash memory, according to an algorithm, so as to maintain a power consumption of the solid state drive below a maximum acceptable power consumption value, the algorithm employing a power consumption cost table; and dynamically adjusting, by the controller, the power consumption cost table based on information received from the PMIC.

In one embodiment, the method includes dynamically adjusting, by the controller, the power consumption cost table prior to initial operation of the solid state drive.

In one embodiment, the dynamically adjusting, by the controller, of the power consumption cost table includes: performing, under the control of the controller executing a built-in-self-test (BIST) procedure, a plurality of test read operations, a plurality of test write operations, and a plurality of test erase operations; and measuring the power consumed by the performing of the plurality of test read operations, the plurality of test write operations, and the plurality of test erase operations.

In one embodiment, the measuring of the power consumed by the performing of the plurality of test read operations, the plurality of test write operations, and the plurality of test erase operations includes measuring, by a power management integrated circuit (PMIC), the power consumed by the performing of the plurality of test read operations, the plurality of test write operations, and the plurality of test erase operations.

In one embodiment, the method includes forming a pool containing a quantity of credits proportional to the maximum acceptable power consumption value; removing a first quantity of credits from the pool for each write operation conducted, at the beginning of the write operation, and replacing the first quantity of credits at the completion of the write operation, the first quantity of credits being proportional to a mean power consumption of a write operation; removing a second quantity of credits from the pool for each read operation conducted, at the beginning of the read operation, and replacing the second quantity of credits at the completion of the read operation, the second quantity of credits being proportional to a mean power consumption of a read operation; removing a third quantity of credits from the pool for each erase operation conducted, at the beginning of the erase operation, and replacing the third quantity of credits at the completion of the erase operation, the third quantity of credits being proportional to a mean power consumption of an erase operation, the mean power consumption of the write operation, the mean power consumption of the read operation, and the mean power consumption of the erase operation being determined from the power consumption cost table; and delaying a command in the command queue when there are insufficient credits in the pool for the command.

BRIEF DESCRIPTION OF THE DRAWINGS

These and other features and advantages of the present invention will be appreciated and understood with reference to the specification, claims and appended drawings wherein:

DETAILED DESCRIPTION

The detailed description set forth below in connection with the appended drawings is intended as a description of exemplary embodiments of a system and method for dynamic self-correcting power management for solid state drive provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1:
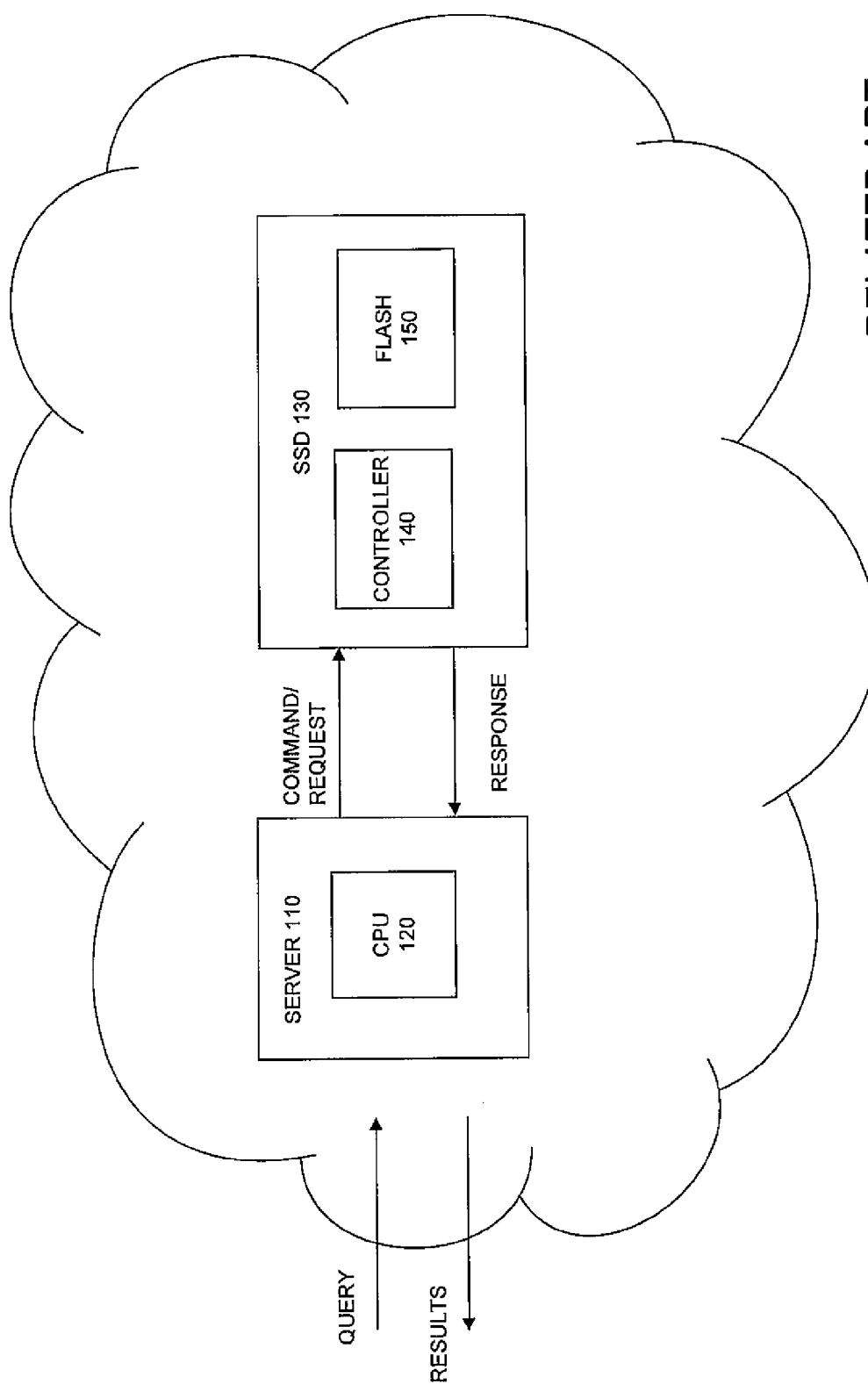
FIG. 1 is a block diagram of a related art server in communication with a storage node.

FIG. 1 is a block diagram of a related art system which includes a server 110 and a storage node, such as an SSD 130, for performing data queries according to prior art implementations. The SSD 130 may be a part of the server 110, or it may be separate from, and in communication with, the server 110, as illustrated in FIG. 1. The server 110 may include a processor, such as a server central processing unit (CPU) 120. The SSD 130 may include an SSD controller 140 and a flash memory 150. The server 110 and the SSD 130 may be implemented in a cloud-based computing environment. The server 110 and the SSD 130 may communicate using a suitable bus such as Peripheral Component Interconnect Express (PCIe), running a suitable protocol.

Figure 2:
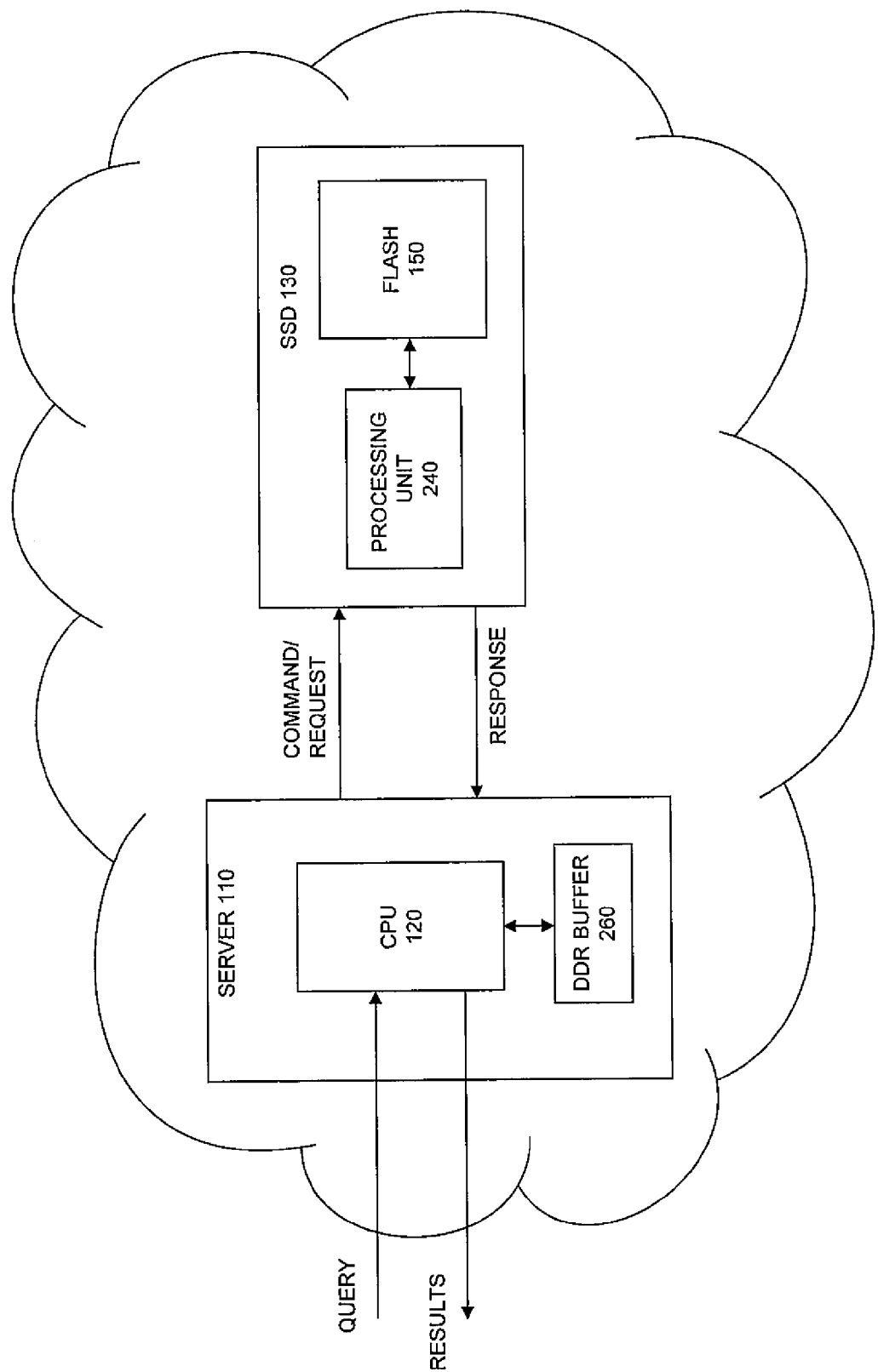
FIG. 2 is a block diagram of a server in communication with a storage node according to an embodiment of the present invention.

As used herein, the phrase "in communication with" refers to direct communication, or indirect communication, via one or more components named or unnamed herein. The server 110 and the SSD 130 can be in communication with each other via a wired or wireless connection. For example, in one embodiment, the SSD 130 may comprise pins (or a socket) to mate with a corresponding socket (or pins) on the server 110 to establish an electrical and physical connection. In another embodiment, the SSD 130 can comprise a wireless transceiver to place the server 110 and the SSD 130 in wireless communication with each other. The server 110 and the SSD 130 may be separately housed from each other, or contained in the same housing. Referring to FIG. 2, in one embodiment, an SSD processing unit 240 may be used as an SSD controller 140, the SSD processing unit 240 being a smart controller having greater processing capability than a conventional SSD controller. In this embodiment, the SSD processing unit 240 is an example of an SSD controller 140.

Figure 3:
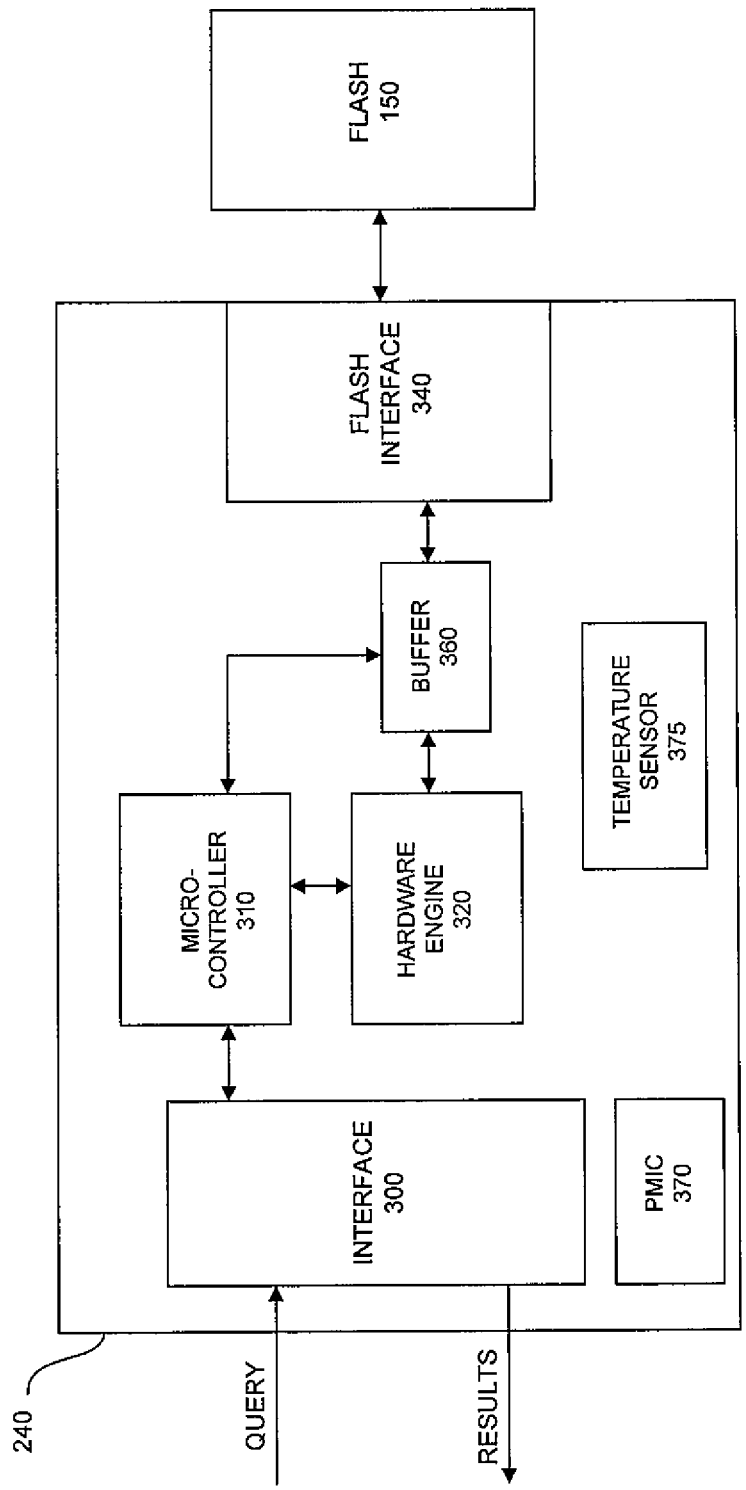
FIG. 3 is a block diagram of a solid state drive processing unit in communication with a flash memory according to an embodiment of the present invention.

Referring to FIG. 3, the SSD processing unit 240 includes, in one embodiment, a host interface 300, a microcontroller 310, which may also be referred to as a central processing unit (CPU), a hardware engine 320, a processing unit buffer 360, and a flash interface 340. The host interface 300 may be, for example, PCIe, NVMe, SATA, Fibre Channel, SAS, SCSI over PCIe, or Ethernet. Other components, such as additional buffers, may also be present in the processing unit 240. The SSD processing unit 240 communicates with the flash memory 150 through the flash interface 340, which may implement a flash channel interface. In one embodiment, there is a separate hardware engine 320 for each flash channel. The SSD processing unit 240 may be a single silicon chip, e.g., a system on a chip (SOC). In one embodiment, the microcontroller 310, the processing unit buffer 360, and the flash interface 340 are all integrated onto a single semiconductor chip (e.g., a single silicon chip), along with a hardware engine 320. The SSD processing unit 240 may include specialized hardware, firmware, or software, referred to as a flash manager, dedicated to managing the operation of the flash memory for high performance while respecting constraints on power consumption, according to embodiments of the present invention. In one embodiment the processing unit 240 contains a power management integrated circuit (PMIC) 370, which performs power-related functions, such as monitoring the dynamic current draw or power consumption of the SSD. The PMIC may be embedded in the SSD processing unit 240 or it may be a separate component in the SSD 130. The SSD 130 may also contain a temperature sensor 375, which may be embedded in the SSD processing unit 240 as shown, or which may be a separate component in the SSD 130.

In operation, a significant portion of the power used by the SSD 130 may be used to perform flash operations, including read operations, erase operations, and write operations. Several flash operations may be conducted, i.e., active, simultaneously under the control of the SSD processing unit 240, and the instantaneous power consumption at any time, due to the flash operations, may be the sum, over all flash operations active at that time, of the power consumed by each flash operation.

In operation, it may be unacceptable for an SSD 130 to exceed its maximum acceptable power consumption value, i.e., the maximum power the power system is capable of delivering to the SSD without risk of shutdown, malfunction, or failure. Exceeding the maximum acceptable power consumption value may be avoided by throttling the SSD 130, i.e., limiting the rate at which flash operations are performed so as to limit the power consumed. Throttling slows the operation of the SSD 130, and it is therefore advantageous to use no more throttling than necessary. To this end, it is advantageous to employ an accurate model of the power consumed by flash operations. Such a model may be implemented as a table, referred to as a power consumption cost table. The power consumption cost table may for example list the power consumed by each kind of flash operation, as a function of the temperature of the SSD.

In one embodiment, a power consumption cost table is initially created in a pre-production phase, when the SSD is designed or when a prototype unit is tested. A design may be simulated numerically, or power consumption values may be obtained from specifications provided by the manufacturer of a flash memory 150 used in the SSD 130. Alternatively, or in addition, a prototype unit may be instrumented with a power-measuring device, and its power consumption in operation may be measured. This pre-production calibration is performed for each drive type or design, which may have characteristics depending on, e.g., the format factor or flash type.

Another characterization of the power consumption may be performed during or after production and may be used to improve a power consumption cost table developed in pre-production. In one embodiment, this is accomplished using a power management integrated circuit (PMIC) 370, together with a built-in self-test (BIST) procedure, which is executed by the SSD processing unit 240. The BIST performs a pattern of one or more read operations, one or more write operations, and one or more erase operations in the flash memory 150, and, during these operations, the PMIC measures the power consumed, and reports the results to the SSD processing unit 240. The SSD processing unit 240 then calculates the power consumed by each type of flash operation and saves the results in the power consumption cost table. In one embodiment, this process is performed in manufacturing, for each SSD 130 manufactured, after the SSD 130 is assembled and before the SSD 130 is shipped. In other embodiments it is instead, or also, performed at other times in the life of the SSD 130, such as at startup.

The power consumption of various flash operations may change over time, e.g., as the temperature of the SSD 130 changes or as the flash memory 150 ages, and in one embodiment the power consumption cost table is adjusted as needed to avoid exceeding the maximum acceptable power consumption value, while also avoiding more throttling than necessary. In particular, one or more power consumption thresholds are used by the SSD processing unit 240 to trigger checking and, if necessary, adjusting of the power consumption cost table. For example, a threshold is set at a value of 0.5 times the maximum acceptable power consumption value. When the PMIC 370 reports an instantaneous power consumption equal to or exceeding this threshold, the SSD processing unit 240 checks and, if necessary, adjusts the values stored in the power consumption cost table.

In one embodiment, checking and adjusting of the values stored in the power consumption cost table proceeds as follows. The processing unit 240 calculates the expected instantaneous power consumption using the number of active flash operations of each kind and the value, from the power consumption cost table, of the expected power consumption for each. If there is a significant discrepancy between the instantaneous power consumption reported by the PMIC 370 and the expected instantaneous power consumption calculated by the SSD processing unit 240, then the SSD processing unit 240 initiates a procedure to dynamically adjust the power consumption cost table. This may involve re-running the BIST, or it may involve monitoring the number of active read operations, the number of active erase operations, and the number of active write operations, as well as the total power consumption reported by the PMIC 370, for some period of time, and inferring, from these observations, corrected values for the power consumption cost table.

During this process, if the power consumption cost table is configured to store power consumption data as a function of temperature, the SSD processing unit 240 may store measured results for the power consumption at the current operating temperature, as measured by the temperature sensor 375, and the SSD processing unit 240 may generate data for temperatures other than the current operating temperature by a number of methods, including but not limited to curve fitting using previously obtained data at other temperatures, and extrapolation using models for the expected dependence on temperature of the power consumption of each flash operation.

In operation, throttling of the SSD 130 based on a power consumption cost table, to avoid exceeding the maximum acceptable power consumption value, may be accomplished using a method based on power credits. In one embodiment, the SSD processing unit 240 creates, at startup, a pool of credits proportional to the maximum acceptable power consumption value. This pool may for example be a number in a register or in memory, initialized and subsequently updated by the SSD processing unit 240. After the pool of credits is initialized, the SSD processing unit 240 removes from the pool a number of credits for each flash operation initiated, and returns the credits to the pool once the flash operation is complete. The number of credits removed for each flash operation bears the same proportion to the initial size of the pool of credits as the power consumed by the flash operations bears to the maximum acceptable power consumption value. As a result, the number of credits remaining in the pool of credits is proportional, at any time, to the power reserve. In one embodiment, the number of credits remaining in the pool of credits is used to trigger checking and, if necessary, adjusting of the power consumption cost table. A pool credit threshold may be set at some value, e.g., at 50% of the initial size of the pool of credits; when the number of credits in the pool falls below this threshold value, the SSD processing unit 240 initiates checking and, if necessary, adjusting of the power consumption cost table.

In one embodiment, the number of credits remaining in the pool of credits is used as part of a throttling strategy to maintain the power consumption of the solid state drive below a maximum acceptable power consumption value. Commands corresponding to read, erase, and write operations to be performed are placed in a command queue and each command is dispatched to the flash memory only when the number of credits in the pool is sufficient to support the operation. For example, if there are 60 credits in the pool of credits, if the next command in the command queue is an erase operation, and if, according to the power consumption cost table, an erase operation requires 100 credits, then the SSD processing unit 240 will delay the command in the command queue, i.e., the SSD processing unit 240 will not dispatch the command to the flash memory, until enough credits have been returned to the pool of credits that 100 credits are available to execute the erase operation. If the SSD 130 contains a temperature sensor 375, then each retrieval of data from the power consumption cost table may use the current operating temperature of the SSD 130 to identify the relevant entry in the power consumption cost table.

Figure 4:
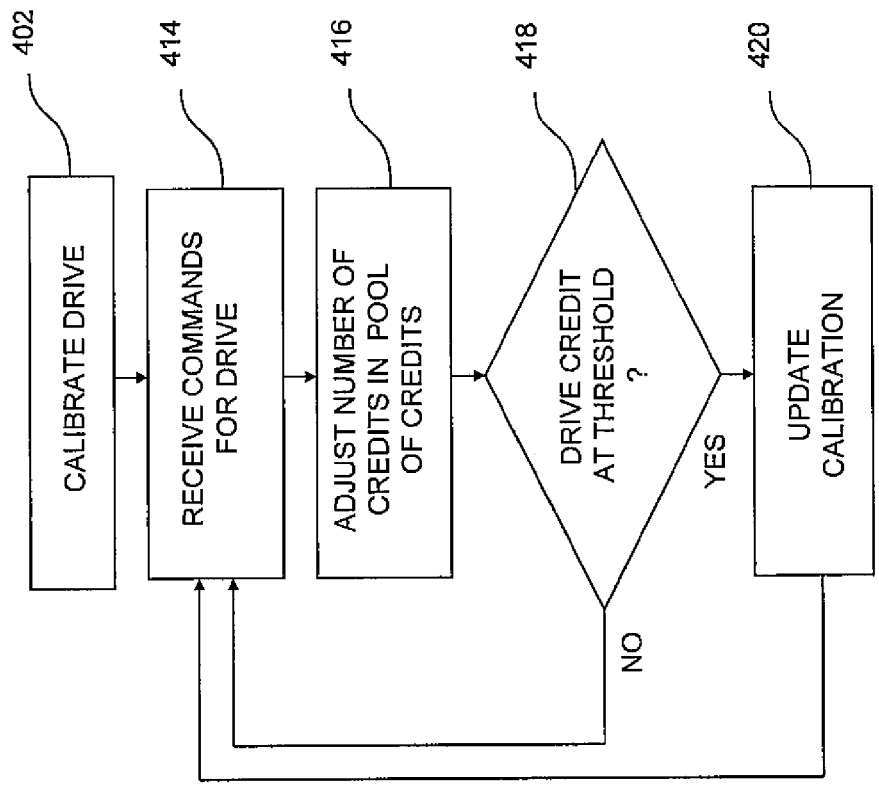
FIG. 4 is a flow chart of a method for operating a solid state drive according to an embodiment of the present invention.

FIG. 4 illustrates a method for dynamic self-correcting power management in a solid state drive, according to embodiments of the present invention. At act 402, the SSD 130 is calibrated for power management. Calibration may be performed in pre-production or after production of the SSD 130, or both. At act 414, the SSD 130 receives commands, corresponding to flash operations, such as read, write, or erase, to be performed by the SSD 130. Each operation on the SSD 130 is assigned a number of credits proportional to the power consumption of the operation, which is estimated from the power consumption cost table. In an act 416, the SSD processing unit 240 adjusts the number of credits remaining in the pool of credits for the SSD 130 by the number of credits assigned to each operation dispatched to flash memory 150.

At act 418, if the number of credits in the pool of credits is above the threshold for checking and, if necessary, adjusting of the power consumption cost table, the process returns to act 414. However if, at act 418, the number of credits in the pool of credits is determined to have fallen below the threshold for checking and, if necessary, adjusting of the power consumption cost table, the process proceeds to act 420. In act 420, the SSD processing unit 240 checks and, if necessary, adjusts the values stored in the power consumption cost table. The process then returns to act 414.

Several alternatives may be used with these embodiments. For example, while solid state drives (SSDs) are discussed in examples above, any type of suitable memory device, such as a hard disk drive (HDD), can be used. Further, embodiments of the present invention may be used in a redundant array of independent disks (RAID) to achieve similar advantages in optimizing performance and resource utilization.

Other embodiments are within the scope and spirit of the invention. For example, the functionality described above can be implemented using software, hardware, firmware, hardwiring, or combinations of any of these. One or more computer processors operating in accordance with instructions may implement the functions associated with managing the use of storage devices in accordance with embodiments of the present invention. If such is the case, it is within the scope of the present disclosure that such instructions may be stored on one or more non-transitory processor readable storage media (e.g., a magnetic disk, non-volatile random-access memory, phase-change memory or other storage medium). Additionally, software or firmware modules implementing functions used by embodiments of the present invention may also be physically located at various positions, including being distributed such that portions of functions are implemented at different physical locations. Accordingly, it is to be understood that a system and method for dynamic self-correcting power management for solid state drive constructed according to principles of this invention may be embodied other than as specifically described herein. The invention is also defined in the following claims, and equivalents thereof.

What is claimed is:

1. A system for power management in a solid state drive (SSD) comprising a flash memory, the system comprising:
   a controller; and
   a power management integrated circuit (PMIC),
   the controller configured to receive commands, each command corresponding to a requested read operation, a requested write operation, or a requested erase operation to be dispatched to the flash memory,
   the controller configured to place each command in a command queue, and to dispatch each command from the command queue to the flash memory, according to an algorithm, so as to maintain a power consumption of the solid state drive below a maximum acceptable power consumption value, the algorithm employing a power consumption cost table,
   the controller configured to dynamically adjust the power consumption cost table based on information received from the PMIC,
   wherein the algorithm comprises:
      forming a pool containing a quantity of credits proportional to the maximum acceptable power consumption value;
      removing a first quantity of credits from the pool for each write operation conducted, at the beginning of the write operation, and replacing the first quantity of credits at the completion of the write operation, the first quantity of credits being proportional to a mean power consumption of a write operation;
      removing a second quantity of credits from the pool for each read operation conducted, at the beginning of the read operation, and replacing the second quantity of credits at the completion of the read operation, the second quantity of credits being proportional to a mean power consumption of a read operation;
      removing a third quantity of credits from the pool for each erase operation conducted, at the beginning of the erase operation, and replacing the third quantity of credits at the completion of the erase operation, the third quantity of credits being proportional to a mean power consumption of an erase operation, the mean power consumption of the write operation, the mean power consumption of the read operation, and the mean power consumption of the erase operation being determined from the power consumption cost table; and
      delaying a command in the command queue when there are insufficient credits in the pool for the command.

2. The system of claim 1, wherein the controller is configured to dynamically adjust the power consumption cost table by:
   performing a built-in-self-test (BIST) procedure comprising:
      a plurality of test read operations;
      a plurality of test write operations; and
      a plurality of test erase operations; and
   measuring the power consumed by the performing of the plurality of test read operations, the plurality of test write operations, and the plurality of test erase operations.

3. The system of claim 1, wherein the controller is configured to dynamically adjust the power consumption cost table prior to initial operation of the SSD.

4. The system of claim 1, wherein the controller is configured to dynamically adjust the power consumption cost table by correlating, during operation of the solid state drive, power consumption data from the PMIC with a frequency to simultaneously perform read operations, write operations, and erase operations.

5. The system of claim 4, wherein the controller is configured to dynamically adjust the power consumption cost table only when the power consumption of the solid state drive exceeds a threshold fraction of the maximum acceptable power consumption value.

6. The system of claim 5, wherein the threshold fraction is 50%.

7. The system of claim 1, wherein the controller comprises a flash manager.

8. The system of claim 1, wherein the controller comprises a central processing unit (CPU).

9. A method for operating a solid state drive comprising a controller, a flash memory, and a power management integrated circuit (PMIC), the method comprising:
   receiving commands, each command corresponding to a requested read operation, a requested write operation, or a requested erase operation to be executed in the flash memory;
   placing each command in a command queue;
   dispatching each command from the command queue to the flash memory, according to an algorithm, so as to maintain a power consumption of the solid state drive below a maximum acceptable power consumption value, the algorithm employing a power consumption cost table;
   dynamically adjusting, by the controller, the power consumption cost table based on information received from the PMIC;
   forming a pool containing a quantity of credits proportional to the maximum acceptable power consumption value;
   removing a first quantity of credits from the pool for each write operation conducted, at the beginning of the write operation, and replacing the first quantity of credits at the completion of the write operation, the first quantity of credits being proportional to a mean power consumption of a write operation;
   removing a second quantity of credits from the pool for each read operation conducted, at the beginning of the read operation, and replacing the second quantity of credits at the completion of the read operation, the second quantity of credits being proportional to a mean power consumption of a read operation;
   removing a third quantity of credits from the pool for each erase operation conducted, at the beginning of the erase operation, and replacing the third quantity of credits at the completion of the erase operation, the third quantity of credits being proportional to a mean power consumption of an erase operation, the mean power consumption of the write operation, the mean power consumption of the read operation, and the mean power consumption of the erase operation being determined from the power consumption cost table; and
   delaying a command in the command queue when there are insufficient credits in the pool for the command.

10. The method of claim 9, comprising dynamically adjusting, by the controller, the power consumption cost table prior to initial operation of the solid state drive.

11. The method of claim 9, wherein the dynamically adjusting, by the controller, of the power consumption cost table comprises:
    performing, under the control of the controller executing a built-in-self-test (BIST) procedure, a plurality of test read operations, a plurality of test write operations, and a plurality of test erase operations; and
    measuring the power consumed by the performing of the plurality of test read operations, the plurality of test write operations, and the plurality of test erase operations.

12. The method of claim 11, wherein the measuring of the power consumed by the performing of the plurality of test read operations, the plurality of test write operations, and the plurality of test erase operations comprises measuring, by a power management integrated circuit (PMIC), the power consumed by the performing of the plurality of test read operations, the plurality of test write operations, and the plurality of test erase operations.

* * * * *